United States Patent
Oshima

(10) Patent No.: US 8,624,356 B2
(45) Date of Patent: Jan. 7, 2014

(54) GROUP III NITRIDE SEMICONDUCTOR SUBSTRATE PRODUCTION METHOD, AND GROUP III NITRIDE SEMICONDUCTOR SUBSTRATE

(75) Inventor: Yuichi Oshima, Tsuchiura (JP)

(73) Assignee: Hitachi Metals, Ltd., Tokyo (JP)

( * ) Notice: Subject to any disclaimer, the term of this patent is extended or adjusted under 35 U.S.C. 154(b) by 560 days.

(21) Appl. No.: 12/413,992

(22) Filed: Mar. 30, 2009

(65) Prior Publication Data

US 2010/0133657 A1   Jun. 3, 2010

(30) Foreign Application Priority Data

Dec. 2, 2008   (JP) .................................. 2008-307377

(51) Int. Cl.
*H01L 29/22* (2006.01)

(52) U.S. Cl.
USPC .... 257/614; 257/615; 257/616; 257/E29.089; 338/143; 338/310

(58) Field of Classification Search
USPC ........................... 257/614–616; 338/143, 310
See application file for complete search history.

(56) References Cited

U.S. PATENT DOCUMENTS

| 6,468,882 | B2 | 10/2002 | Motoki et al. | |
|---|---|---|---|---|
| 6,936,357 | B2* | 8/2005 | Melnik et al. | 428/698 |
| 2002/0028564 | A1 | 3/2002 | Motoki et al. | |
| 2009/0315151 | A1* | 12/2009 | Hashimoto et al. | 257/615 |
| 2010/0031876 | A1* | 2/2010 | D'Evelyn | 117/71 |
| 2010/0061913 | A1* | 3/2010 | Hariharan et al. | 423/342 |

FOREIGN PATENT DOCUMENTS

| CN | 1332480 A | 1/2002 |
|---|---|---|
| JP | 2007-84435 A | 4/2007 |

* cited by examiner

Primary Examiner — Elias M Ullah
(74) Attorney, Agent, or Firm — Foley & Lardner LLP

(57) ABSTRACT

A group III nitride semiconductor substrate production method includes preparing a bulk crystal formed of a group III nitride semiconductor single crystal. The group III nitride semiconductor single crystal has one crystalline plane and an other crystalline plane. Hardness of the other crystalline plane is smaller than hardness of the one crystalline plane. The prepared bulk crystal is cut from the other crystalline plane to the one crystalline plane of the bulk crystal.

6 Claims, 8 Drawing Sheets

GROUP III NITRIDE SEMICONDUCTOR SUBSTRATE PRODUCTION METHOD, AND GROUP III NITRIDE SEMICONDUCTOR SUBSTRATE

The present application is based on Japanese patent application No. 2008-307377, the entire contents of which are incorporated herein by reference.

BACKGROUND OF THE INVENTION

1. Field of the Invention

The present invention relates to a group III nitride semiconductor substrate production method, and a group III nitride semiconductor substrate. In particular, it relates to a group III nitride semiconductor substrate production method, which involves cutting a bulk crystal, and a group III nitride semiconductor substrate.

2. Description of the Related Art

Conventionally, a GaN substrate production method is known that includes vapor-growing a GaN single crystal on a substrate to produce a GaN monocrystalline ingot, and slicing the formed GaN monocrystalline ingot parallel to the growing direction to produce a GaN substrate.

According to the above production method, it is possible to obtain a GaN substrate with low dislocation density surface because dislocations extend in the GaN single crystal growing direction and are parallel to the substrate surface sliced by slicing the ingot parallel to the dislocation-extending direction.

Refer to JP-A-2007-84435, for example.

However, with the above GaN substrate production method, the problems may arise that when, to shorten the period of time of slicing, the slicing speed is increased, the crystal defect depth (the damaged layer depth) caused by slicing may be increased, and even after grinding the sliced surface, the surface roughness may be varied by saw marks formed in the sliced surface exposed by slicing parallel to the wire moving direction of a wire saw used in slicing.

SUMMARY OF THE INVENTION

Accordingly, it is an object of the present invention to provide a group III nitride semiconductor substrate production method capable of producing a high-precision high-purity group III nitride semiconductor substrate for a short time, and to provide a group III nitride semiconductor substrate produced by that method.

(1) According to one embodiment of the invention, a group III nitride semiconductor substrate production method comprises:

preparing a bulk crystal comprising a group III nitride semiconductor single crystal, the group III nitride semiconductor single crystal comprising one crystalline plane and an other crystalline plane, a hardness of the other crystalline plane being smaller than a hardness of the one crystalline plane; and cutting the prepared bulk crystal from the other crystalline plane to the one crystalline plane of the bulk crystal.

In the above embodiment (1), the following modifications and changes can be made.

(i) The cutting is performed at an angle from not less than 0 to less than 90 degrees between the cutting direction and the [0 0 0 1] direction.

(ii) The cutting is performed at an angle from not less than 0 to not more than 45 degrees between the cutting direction and the [0 0 0 1] direction.

(iii) The cutting is performed by cutting the bulk crystal at a speed of not less than 2 mm/h.

(2) According to another embodiment of the invention, a group III nitride semiconductor substrate formed by cutting a group III nitride semiconductor single crystal comprises:

a bulk crystal comprising the group III nitride semiconductor single crystal, the group III nitride semiconductor single crystal comprising one crystalline plane and an other crystalline plane, a hardness of the other crystalline plane being smaller than a hardness of the one crystalline plane, wherein the bulk crystal is cut from the other crystalline plane to the one crystalline plane of the bulk crystal.

In the above embodiment (2), the following modifications and changes can be made.

(iv) The damaged layer depth caused by the cutting positioned in a surface of the group III nitride semiconductor substrate exposed after the cutting is not more than 50 μm from the surface.

(v) The absolute value of a difference between one surface roughness of a ground surface, exposed after grinding the damaged layer, in one direction parallel to the ground surface and the other surface roughness of the ground surface in the other direction different from the one direction is not more than 10 nm.

(vi) The crystalline orientation distribution in the ground surface is not more than a central value ±0.05°.

(vii) The cutting is performed by a wire saw containing iron, and the iron concentration in the substrate is not more than $1\times10^{16}$ cm$^{-3}$.

(3) According to another embodiment of the invention, a group III nitride semiconductor substrate comprises:

a group III nitride semiconductor single crystal comprising one crystalline plane and an other crystalline plane, a hardness of the other crystalline plane being smaller than a hardness of the one crystalline plane; and a substrate surface, wherein an absolute value of a difference between one surface roughness of the substrate surface in one direction parallel to the substrate surface and an other surface roughness of the substrate surface in an other direction different from the one direction is not more than 10 nm.

Advantages

According to the invention, it is possible to provide a group III nitride semiconductor substrate production method capable of producing a high-precision high-purity group III nitride semiconductor substrate for a short time, and to provide a group III nitride semiconductor substrate produced by that method.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Group III nitride semiconductor (e.g., boron nitride (BN), aluminum nitride (AlN), gallium nitride (GaN), indium nitride (InN)) crystals have any structure of wurtzite (WZ), zinc blende (ZB), or rock salt (RS). Here, WZ crystalline group III nitride semiconductors are polarized in the [0 0 0 1] direction (c-axis direction) by a difference between electronegativities of group III and V elements. For example, planes perpendicular to the c-axis direction are classified into group III and V polar planes. As one example, group III nitride semiconductor GaN has Ga and N polar planes, and the N polar plane tends to be etched more than the Ga polar plane.

Here, the present inventors have discovered that when measuring the Vickers hardness of each of Ga and N polar planes of GaN, the Vickers hardness of the N polar plane is much softer than the Vickers hardness of the Ga polar plane. Its results are shown in FIG. 1.

Figure 1:
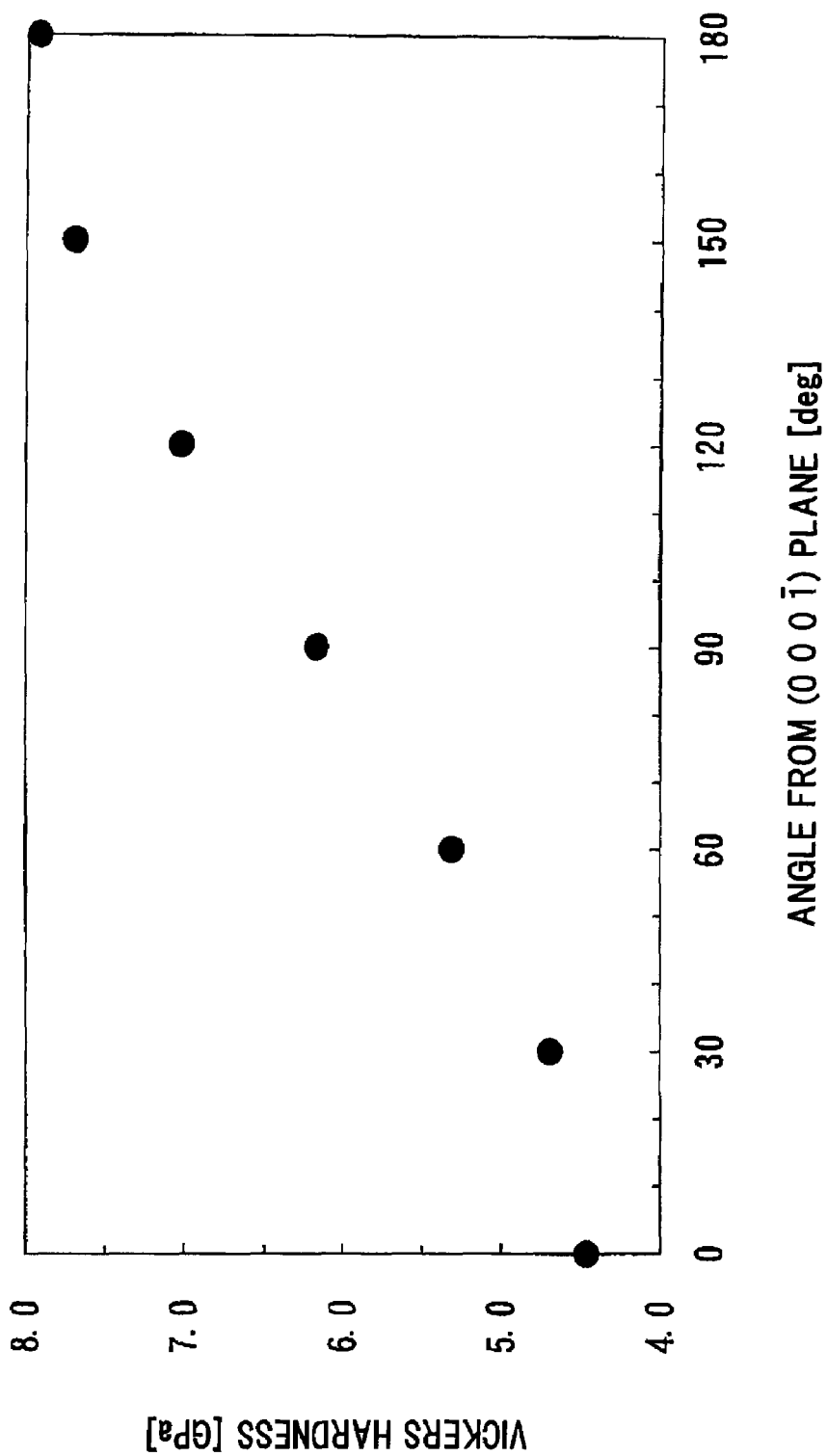
FIG. 1 is a diagram showing plane orientation dependency of Vickers hardness of a polar plane of a GaN single crystal.
Figure 8:
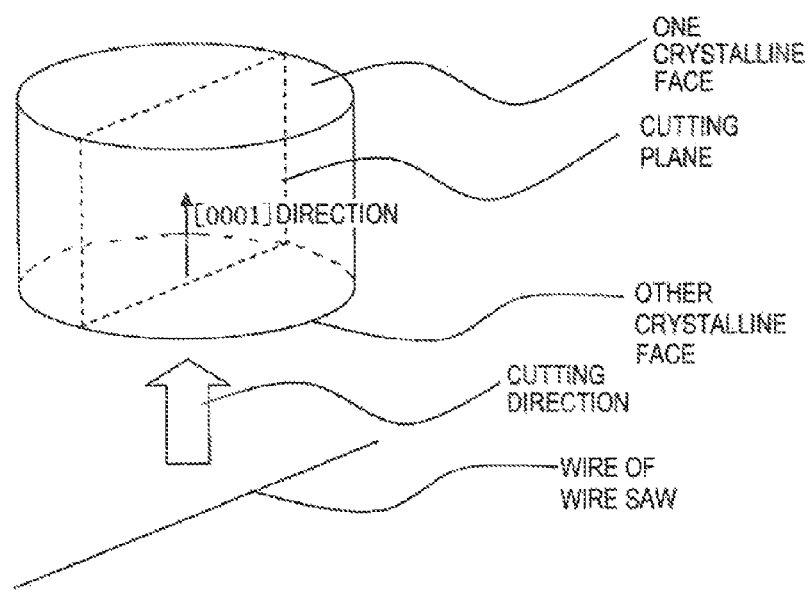
FIG. 8 is a schematic illustrating the cutting direction relative to crystalline faces of a bulk Group III nitride semiconductor crystal.

FIG. 1 shows plane orientation dependency of Vickers hardness of a GaN single crystal and FIG. 8 illustrates the cutting direction relative to crystalline faces of a bulk Group III nitride semiconductor crystal, namely the GaN single crystal.

As seen from FIG. 1, in the GaN single crystal, the Vickers hardness of the (0 0 0 −1) plane, i.e., N polar plane is on the order of 4.4 GPa, while the Vickers hardness of the (0 0 0 1) plane at the angle of 180° to the (0 0 0 −1) plane, i.e., Ga polar plane is on the order of 7.9 GPa, which is harder than the Vickers hardness of the N polar plane. As the angle to the (0 0 0 −1) plane is greater, the Vickers hardness increases. Specifically, as the angle to the (0 0 0 −1) plane exceeds 30° up to 45°, the Vickers hardness increases substantially monotonically, and at angles exceeding 45°, the rate of increase is higher. It is shown that as the angle increases from 150° to 180°, the Vickers hardness is saturated. The −n (n: natural number) in a Miller index, such as (0 0 0 −1), refers to a negative intercept with a specified coordinate axis.

In this manner, the present inventors have, for the first time, found the fact that, in GaN, the mechanical hardness of Ga and N polar planes depends on crystalline orientations. Based on this fact, the present inventors have found that, in group III nitride semiconductors including GaN single crystals, slicing is performed easily from a mechanically soft crystalline plane (e.g., N polar plane in the case of GaN) to a mechanically hard crystalline plane (e.g., Ga polar plane in the case of GaN).

In other words, the present inventors have found that, in group III nitride semiconductors comprising one crystalline plane and the other crystalline plane having a smaller hardness than the one crystalline plane, slicing is performed easily from the other crystalline plane (mechanically soft crystalline plane) to the one crystalline plane (mechanically hard crystalline plane). Also, the present inventors have found that when slicing a bulk crystal comprising a group III nitride semiconductor single crystal to fabricate a nonpolar or semipolar substrate, slicing is performed easily from its mechanically soft crystalline plane to mechanically hard crystalline plane.

Group III Nitride Semiconductor Substrate Manufacturing Method

Figure 2:
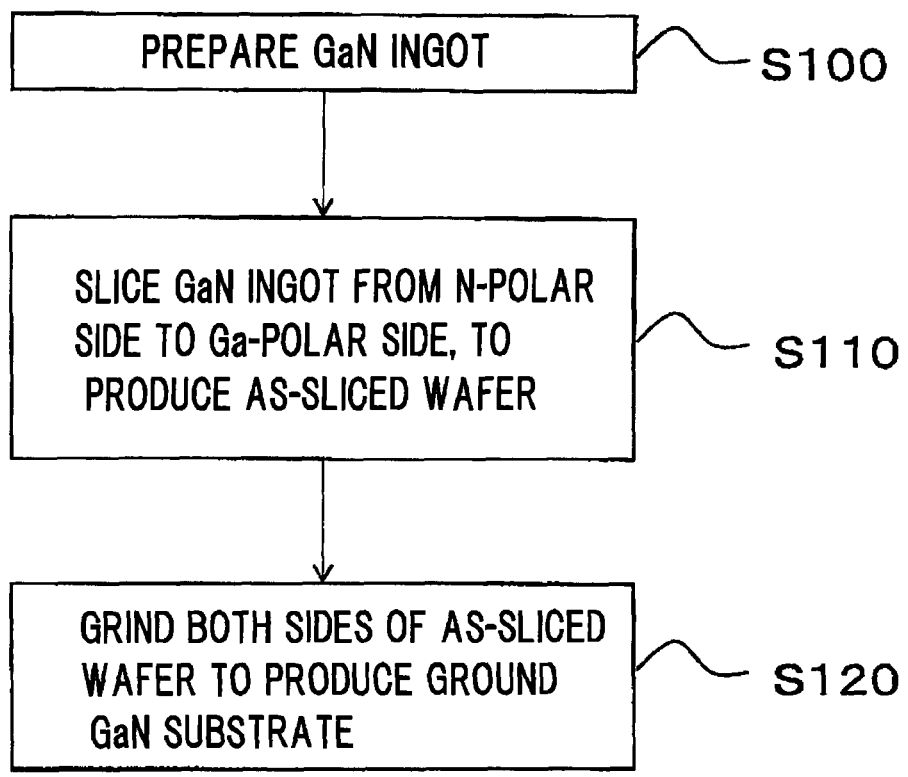
FIG. 2 is a diagram showing one example of manufacturing flow of a group III nitride semiconductor substrate in an embodiment according to the present invention.

FIG. 2 shows one example of manufacturing flow of a group III nitride semiconductor substrate in an embodiment according to the present invention.

The process for manufacturing a group III nitride semiconductor substrate in this embodiment comprises preparing a bulk crystal comprising a group III nitride semiconductor single crystal comprising one crystalline plane and the other crystalline plane having a smaller hardness than the one crystalline plane, cutting the prepared bulk crystal from the other crystalline plane to the one crystalline plane of the bulk crystal to provide a surface-untreated group III nitride semiconductor substrate, and grinding the frontside and backside cut surfaces (herein, also referred to as sliced surfaces) of the group III nitride semiconductor substrate obtained.

Below is explained one example of manufacturing a GaN substrate as the group III nitride semiconductor substrate.

Preparing a GaN Ingot

First, as one example, using Hydride Vapor Phase Epitaxy (HVPE), a thick GaN film is formed on a Ga or N polar plane of a GaN monocrystalline substrate with a c-plane, to manufacture a monocrystalline GaN ingot (S100, S denoting Step). Also, sapphire substrate surface may be pretreated using Epitaxial Lateral Overgrowth (ELO) or the like. And a thick GaN film is formed by HVPE as a nitride semiconductor. Subsequently, the sapphire substrate is removed by mechanical grinding or laser liftoff. This also results in a GaN ingot as a bulk crystal comprising a GaN single crystal.

Cutting

Subsequently, the GaN ingot obtained is cut (herein, also referred to as "sliced"). Specifically, the GaN ingot comprises a first crystalline plane having a first hardness and a second crystalline plane having a smaller second hardness than the first crystalline plane, and in this embodiment, is sliced from the second crystalline plane to the first crystalline plane (S110). For example, the GaN ingot is sliced from its N polar plane to Ga polar plane in this embodiment. The slicing may be implemented with a wire saw having a wire such as a piano wire (steel wire). Also, the slicing may be implemented at a slicing speed of not less than 2 mm/h. This results in a sliced GaN substrate (herein, also referred to as "as-sliced wafer").

As long as slicing is performed toward one crystalline plane having a greater hardness than the hardness of the other crystalline plane, the slicing is not limited to the case of cutting from the N polar plane to Ga polar plane. For example, the GaN ingot may be sliced at an angle between the cutting (slicing) direction and +c-axis direction, i.e., [0 0 0 1] direction ranging not less than 0 and less than 90 degrees, preferably not less than 0 and not more than 45 degrees.

Grinding

Subsequently, both frontside and backside surfaces of the as-sliced wafer are mirror-ground (S120). In this grinding, there is removed a damaged layer containing damages such as crystalline defects caused by cutting inward from the as-sliced wafer surfaces. In this embodiment, the damaged layer depth is not more than 50 μm, and therefore in the grinding, the grinding and removal is performed at least from the as-sliced wafer surfaces up to a depth on the order of 50 μm. This results in a ground GaN substrate in this embodiment having exposed ground surfaces with the damaged layer removed therefrom.

The group III nitride semiconductor is not limited to GaN, but may use other group III nitride semiconductors having polarities similar to AlN, GaN, or the like. Also, the GaN ingot in this embodiment may be manufactured using metal organic vapor phase epitaxy (MOVPE), molecular beam epitaxy (MBE), Na flux, ammonothermal growth, or the like.

Advantages of the Embodiment

Since the group III nitride semiconductor substrate manufacturing method in this embodiment slices a bulk crystal from the other crystalline plane to one crystalline plane having a greater hardness than the hardness of the other crystalline plane, it is possible to reduce the thickness of the damaged layer of the sliced substrate, i.e., the depth from the substrate surface to a region end containing crystalline defect portion.

For example, it is possible to reduce the thickness of the damaged layer even if the slicing speed is increased using a bulk crystal comprising a hard and fragile GaN single crystal compared to semiconductor crystals such as Si, GaAs, and the like. This allows a reduction of the damaged layer thickness and enhancement of the slicing speed.

Reducing the damaged layer thickness allows a reduction in grinding amount in grinding. Accordingly, in the case of adding, to the thickness of the group III nitride semiconductor substrate manufactured by grinding, the damaged layer thickness caused by cutting as a margin during slicing it is possible to reduce the thickness of that margin. This allows an increase in the number of substrates which can be cut out of one ingot.

Further, even if the slicing speed is increased to 2 mm/h or more as one example, it is possible to inhibit an increase of the damaged layer thickness, and therefore substantially shorten the period of time of slicing the bulk crystal and manufacturing the group III nitride semiconductor substrate. For example, in the prior art, the slicing speed is at most 1 mm/h, and therefore the period of time required in slicing a 2 inch (50.8 mm) diameter bulk crystal is not less than 2 days, whereas the manufacturing method in the present embodiment can increase the slicing speed doubly or more, and therefore shorten the period of time required in slicing a 2 inch diameter bulk crystal to ½ or less.

Also, in the prior art, GaN crystals cut by a wire saw may have striped unevenness formed parallel to the wire moving direction. This is called saw marks, and is visible. GaN crystals have a high hardness, and during GaN ingot cutting, therefore tend to cause wire bending or deflection, to produce saw marks. Also, the higher the slicing speed, the more saw marks occur. GaN substrates having remarkable saw marks tend to leave those marks in their ground surfaces after grinding, and therefore produce a striped pattern in the ground surfaces due to surface roughness variations, or tend to leave shallow striped unevenness in the ground surfaces, and render ground surface roughness anisotropic. However, since the group III nitride semiconductor substrate manufacturing method in the present embodiment slices a bulk crystal i.e., GaN ingot from the other crystalline plane to one crystalline plane having a greater hardness than the hardness of the other crystalline plane, even when grinding the sliced surface of the sliced GaN substrate it is possible to make the ground surface roughness isotropic.

Also, the group III nitride semiconductor substrate manufacturing method in the present embodiment slices a bulk crystal from the other crystalline plane to one crystalline plane having a greater hardness than the hardness of the other crystalline plane. In other words, since it slices a bulk crystal from its mechanically soft plane to hard plane, it is possible to shorten the period of time of slicing even in the case of a hard bulk crystal. This allows a decrease in wire abrasion of a wire saw, and inhibiting wire constituent material produced by wire abrasion from contaminating the sliced crystal surface, i.e., as-sliced wafer surface. Accordingly, it is possible to manufacture a high-purity group III nitride semiconductor substrate.

Also, for example, the off angle of surface of a GaN substrate used as an underlying substrate in epitaxial growth significantly affects composition of epitaxial growth layers such as InGaN, AlGaN, etc. Accordingly, the off angle of the GaN substrate surface requires precise control and management. However, in the prior art, when slicing a hard crystal such as a GaN crystal, high-speed slicing may cause wire bending or deflection from an intended position of the GaN ingot. In this case, crystalline orientation distributions in the sliced surface may be large. This sliced surface whose crystalline orientation distributions are large can be modified by obliquely grinding the sliced surface, but in order to ensure specified finished thickness, requires making the original cutout thick. On the other hand, since the group III nitride semiconductor substrate manufacturing method in the present embodiment slices a bulk crystal from the other crystalline plane to one crystalline plane having a greater hardness than the hardness of the other crystalline plane, proper slicing at an intended position of the GaN ingot is possible. This allows manufacturing a good surface accuracy substrate, i.e., a high accuracy GaN substrate.

Example 1

First, a 2 inch c-plane GaN substrate is prepared. Subsequently, on the Ga polar plane of the GaN substrate prepared is further grown GaN by HVPE. This results in a 20 mm-thick GaN ingot.

Subsequently, using a wire saw, the GaN ingot manufactured is sliced parallel to the c-axis. That is, the slicing is performed from the N polar side to Ga polar side, i.e., in the [0 0 0 1] direction and from the N polar plane to Ga polar plane. Here, used as the wire of the wire saw is a 0.16 mm piano wire. Also, there is prepared a coating material with 5 μm average grain size free abrasive diamond grains dispersed in oil slurry. The GaN ingot portion is wire-saw-sliced (cut), supplying this coating material thereto. The temperature of the oil slurry is set at 30° C. Also, the cutting speed is set at 4 mm/h.

This results in an as-sliced GaN wafer having exposed sliced surfaces at both its sides. The as-sliced wafer obtained is a GaN substrate whose M-plane, i.e., (10-10) plane is a principal surface, and is 20 mm×40 mm-sized and 0.6 mm-thick. The period of time required for cutting is approximately 5 hours. Also, no wire bending is caused during GaN ingot slicing. Here, no saw marks are observed in the cut surface of the as-sliced wafer, i.e., the substrate surface exposed by slicing.

The damaged layer depth of the as-sliced wafer surface obtained is calculated by microscopic Raman spectroscopy. Here, the Raman spectral peak is shifted by the crystal lattice strained due to stress caused in the object to be measured. Accordingly, the damaged layer depth is calculated by microscopic Raman spectroscopic measurement of the as-sliced wafer cleavage section inward from the as-sliced wafer surface, and Raman peak shift measurement to the depth from the surface.

Figure 3:
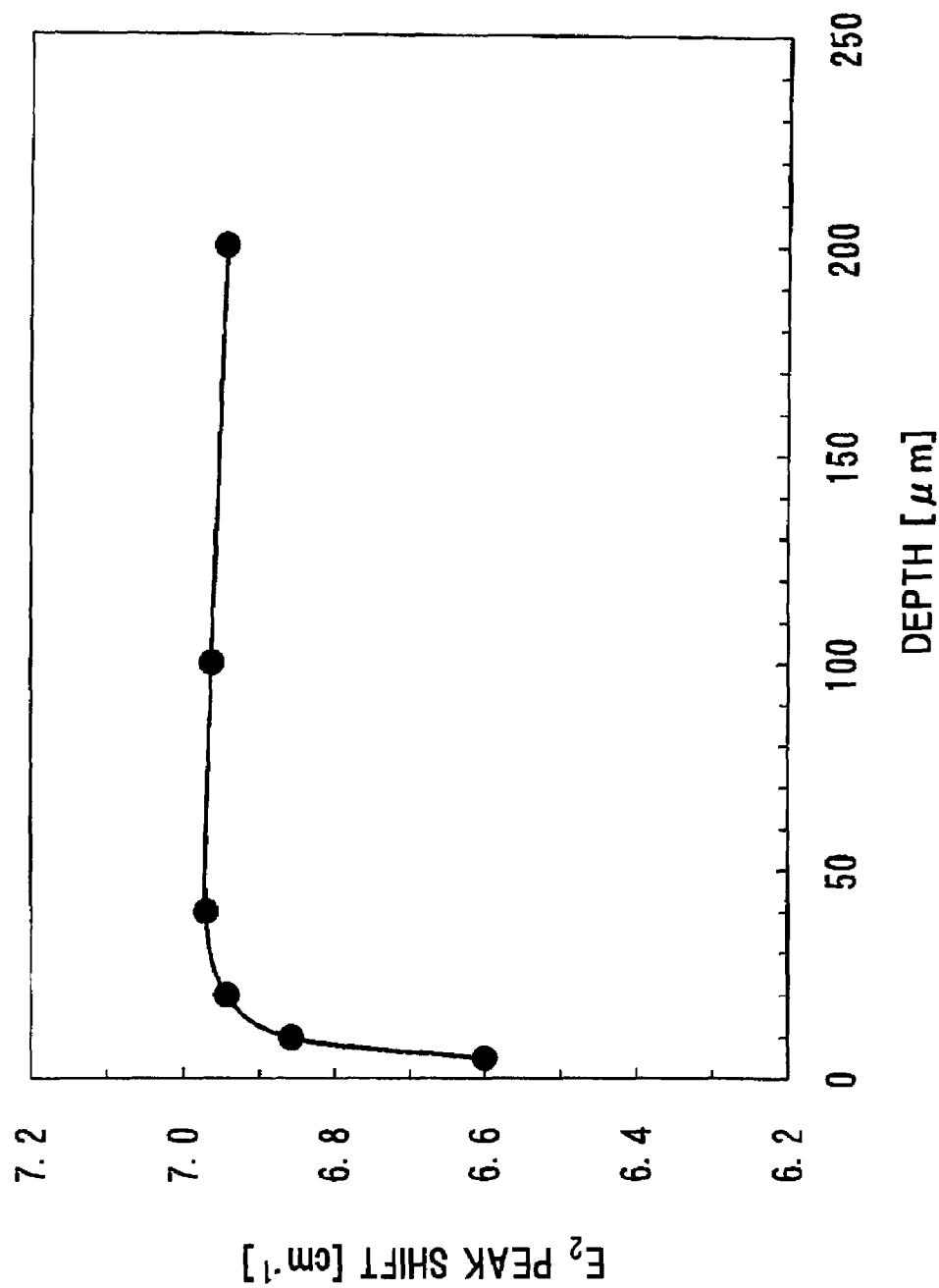
FIG. 3 is a diagram showing results of microscopic Raman spectroscopic measurement of an as-sliced wafer in Example 1 of the invention.

FIG. 3 shows results of microscopic Raman spectroscopic measurement of an as-sliced wafer in Example 1.

Referring to FIG. 3, in the region from as-sliced wafer surface (at the depth of 0 μm in FIG. 3) to the depth on the order of 10 μm, the Raman peak shifts to the low wave number side due to damages such as crystalline defects. The Raman peak varies gradually to the high wave number side with increasing depth from the sliced surface, and at depths of 40 μm or more, is saturated on the order of a wave number of 6.95 cm$^{-1}$. From this result, the damaged layer depth of the as-sliced wafer in Example 1 is considered to be not more than 40 μm.

Subsequently, both surfaces of the as-sliced wafer in Example 1 are mirror-ground by 50 μm's. This results in a 0.5 mm-thick ground GaN substrate with mirror-ground surfaces. Since the ground GaN substrate in Example 1 is formed by slicing the GaN ingot in the [0 0 0 1] direction and subsequently grinding the sliced surfaces, its principal surface is an M-plane, i.e., (10-10) plane.

The surface roughness (RMS value) of the ground GaN substrate in Example 1 is measured under an atomic force microscope (AFM). The surface roughness measurement is performed in 4 directions inclined by 45°'s to a wire moving direction of a wire saw taken as a reference.

Figure 4:
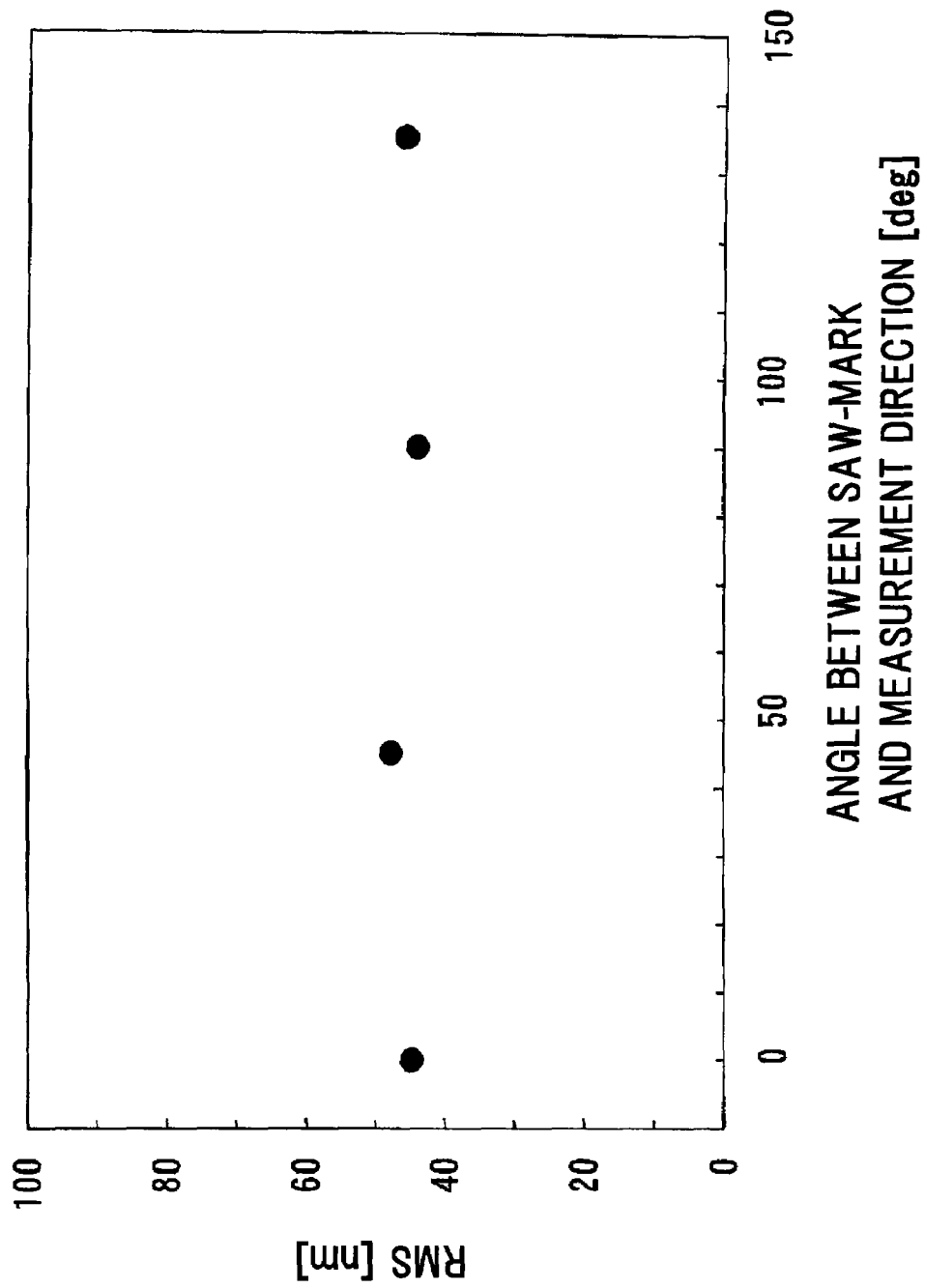
FIG. 4 is a diagram showing results of measuring surface roughness of a ground GaN substrate in Example 1 of the invention.

FIG. 4 shows results of measuring surface roughness of a ground GaN substrate in Example 1.

Referring to FIG. 4, the RMS value for the ground GaN substrate surface shows a substantially constant regardless of measuring directions. Specifically, taking the RMS value measured in the wire moving direction as a reference value (in FIG. 4, the value measured at the angle of 0°), the absolute values of differences between this reference value, and RMS values of surfaces at angles of 45°, 90° and 135° to the wire moving direction are within the range of not more than 10 nm. This verifies that the surface roughness of the ground GaN substrate in Example 1 is isotropic, in other words, there occur no striped pattern and unevenness left in the sliced and ground surface roughness according to wire moving directions of the wire saw, i.e., no phenomenon of unevenness (herein, also referred to "saw mark effect") occurring in particular directions only.

Also, the RMS value of surface roughness in the 100 μm×100 μm region in the ground GaN substrate surface in Example 1 is 5 nm. Further, the dispersion of crystalline orientation distributions in the ground GaN substrate surface is measured by an X-ray diffraction method. Its result verifies that the dispersion of crystalline orientation distributions in the ground GaN substrate surface in Example 1 is as small as a central value ±0.01°, allowing high-precision GaN ingot slicing.

Subsequently, on the ground GaN substrate surface is epitaxially grown 3 μm-thick GaN using MOVPE, to obtain the GaN substrate with an epitaxial layer. The depth-direction profile of an iron (Fe) impurity concentration in the GaN substrate with the epitaxial layer is measured by SIMS analysis. Its result verifies that the Fe concentrations in the GaN layer, at the interface and in the GaN substrate are not more than a lower detection limit ($2\times10^{15}$ cm$^{-3}$).

Example 2

First, a 20 mm-thick GaN ingot is fabricated in the same manner as in Example 1. Subsequently, using the same conditions as in Example 1, the GaN ingot is sliced from the N polar side to Ga polar side, parallel to the (1 1 −2 2) plane, i.e., in the [−1 −1 2 3] direction. In Example 2, the slicing speed is set at 2 mm/h. This results in an as-sliced GaN wafer (23.5 mm×40 mm-sized and 0.6 mm-thick) in Example 2. The period of time required for cutting is approximately 12 hours.

Also, no wire bending is caused during GaN ingot slicing. Also, no saw marks are observed in the cut surface of the as-sliced wafer.

The damaged layer depth of the as-sliced wafer surface in Example 2 is calculated by microscopic Raman spectroscopy in the same manner as in Example 1. From this result, the damaged layer depth caused by slicing is considered to be not more than 50 μm.

Subsequently, both surfaces of the as-sliced wafer in Example 2 are mirror-ground by 70 μm's. This results in a 0.46 mm-thick ground GaN substrate with mirror-ground surfaces. Since the ground GaN substrate in Example 2 is formed by slicing the GaN ingot in the [−1 −1 2 3] direction and subsequently grinding the sliced surfaces, its principal surface is a semipolar (1 1 −2 2) plane.

The surface roughness (RMS value) of the ground GaN substrate in Example 2 is measured under an atomic force microscope (AFM). The surface roughness measurement is performed in 4 directions inclined by 45°'s to a wire moving direction of a wire saw taken as a reference.

Figure 5:
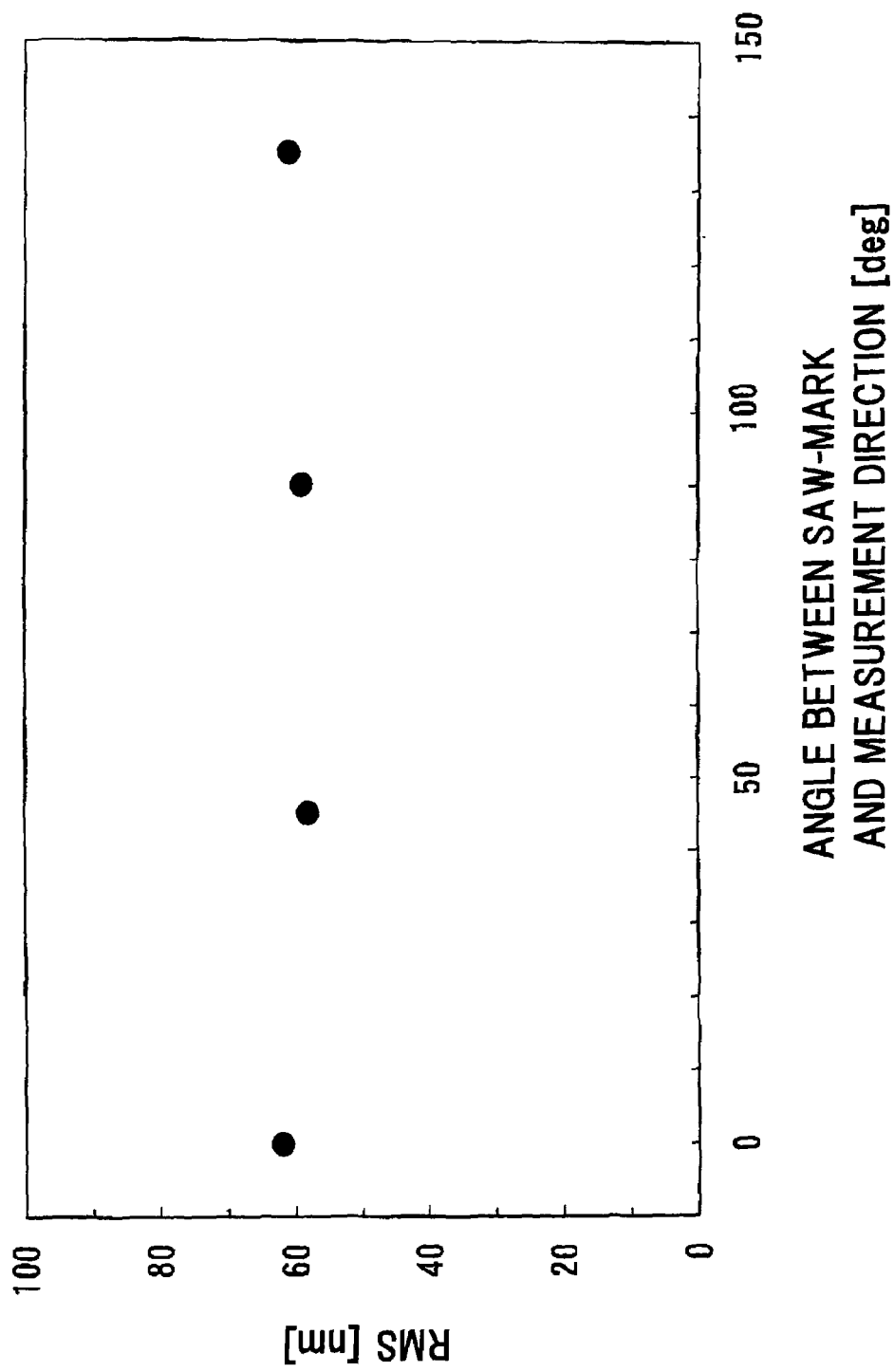
FIG. 5 is a diagram showing results of measuring surface roughness of a ground GaN substrate in Example 2 of the invention.

FIG. 5 shows results of measuring surface roughness of a ground GaN substrate in Example 2.

Referring to FIG. 5, the RMS value for the ground GaN substrate surface shows a substantially constant regardless of measuring directions. Specifically, taking the RMS value measured in the wire moving direction as a reference value (in FIG. 5, the value measured at the angle of 0°), the absolute values of differences between this reference value, and RMS values of surfaces at angles of 45°, 90° and 135° to the wire moving direction are within the range of not more than 10 nm. This verifies that the surface roughness of the ground GaN substrate in Example 2 is isotropic, in other words, there is no saw mark effect.

Also, the dispersion of crystalline orientation distributions in the ground GaN substrate surface in Example 2 is measured by an X-ray diffraction method. Its result verifies that the dispersion of crystalline orientation distributions in the ground GaN substrate surface in Example 2 is as small as a central value ±0.02°, allowing high-precision GaN ingot slicing.

Subsequently, on the ground GaN substrate surface in Example 2 is epitaxially grown 3 μm-thick GaN using MOVPE, to obtain the GaN substrate with an epitaxial layer. The depth-direction profile of a Fe impurity concentration in the GaN substrate with the epitaxial layer is measured by SIMS analysis. Its result verifies that the Fe concentrations in the GaN layer, at the interface and in the GaN substrate are not more than a lower detection limit ($2\times10^{15}$ cm$^{-3}$).

Comparative Example 1

First, a 20 mm-thick GaN ingot is fabricated in the same manner as in Example 1. Subsequently, using the same conditions as in Example 1, the GaN ingot is sliced from the Ga polar side to N polar side, parallel to the c-axis, i.e., in the [0 0 0 −1] direction. The period of time required for completely cutting the 20 mm-thick GaN ingot is approximately 10 hours due to large wire bending during GaN ingot slicing. That is, in Comparative Example 1, the slicing speed is virtually 2 mm/h. This results in an as-sliced GaN wafer (20 mm×40 mm-sized and 0.6 mm-thick) in Comparative Example 1. Saw marks are clearly observed in the cut surface of the as-sliced wafer.

The damaged layer depth of the as-sliced wafer surface in Comparative Example 1 is calculated by microscopic Raman spectroscopy in the same manner as in Example 1. From this result, the damaged layer depth caused by slicing is considered to be on the order of 150 μm.

Subsequently, both surfaces of the as-sliced wafer in Comparative Example 1 are mirror-ground by 170 μm's. This results in a 0.26 mm-thick ground GaN substrate with mirror-ground surfaces. Since the ground GaN substrate in Comparative Example 1 is formed by slicing the GaN ingot in the c-axis direction and subsequently grinding the sliced surfaces, its principal surface is an M-plane, i.e., (10-10) plane. In Comparative Example 1, the damaged layer depth is as deep as 150 μm compared to Example 1, and therefore a large amount of grinding is required for removing the damaged layer, and also the final ground GaN substrate thickness is as thin as 0.26 mm.

The surface roughness (RMS value) of the ground GaN substrate in Comparative Example 1 is measured under an atomic force microscope (AFM). The surface roughness measurement is performed in 4 directions inclined by 45°'s to a wire moving direction of a wire saw taken as a reference.

Figure 6:
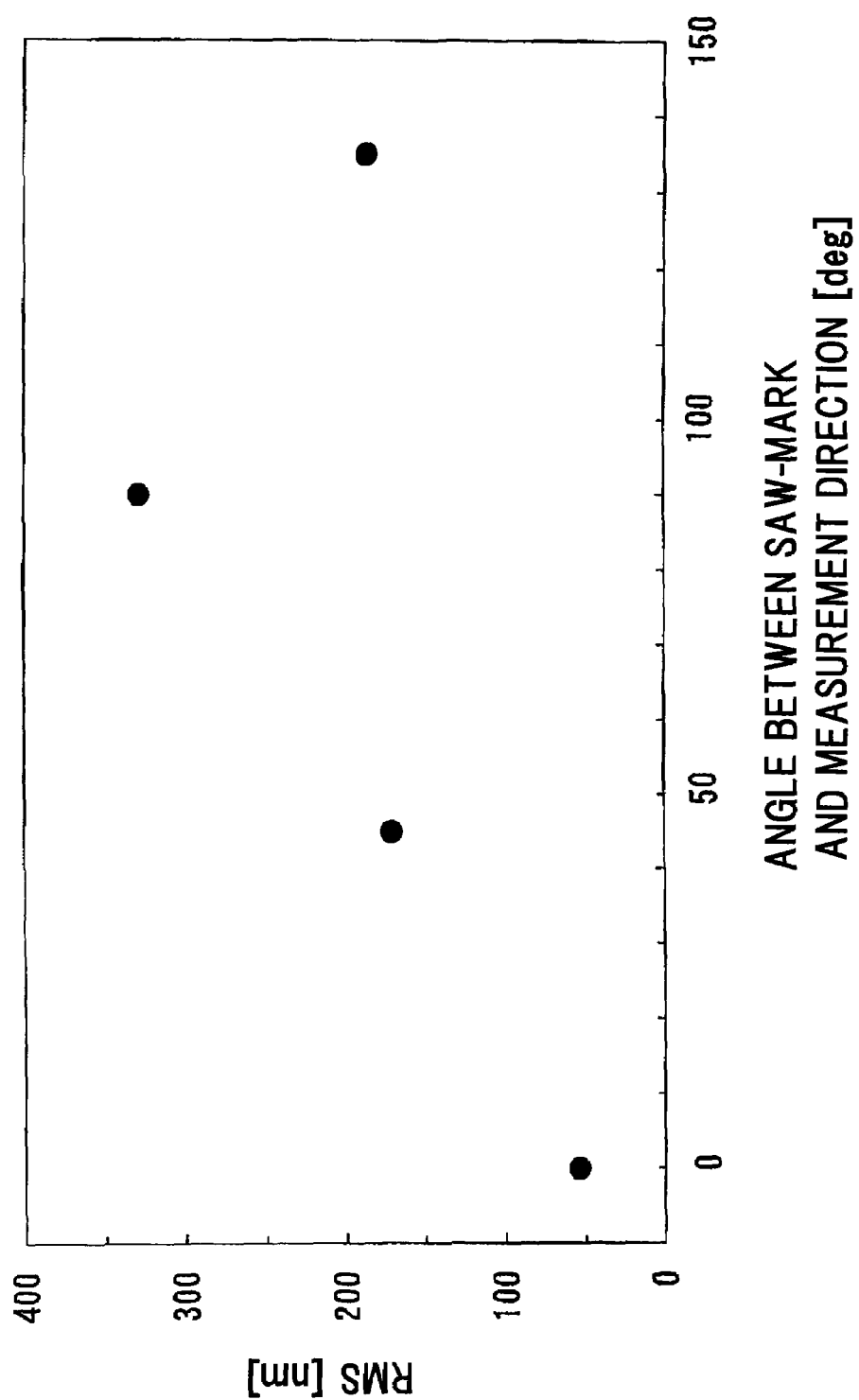
FIG. 6 is a diagram showing results of measuring surface roughness of a ground GaN substrate in Comparative Example 1.

FIG. 6 shows results of measuring surface roughness of a ground GaN substrate in Comparative Example 1.

Referring to FIG. 6, it is observed that the RSM value for the ground GaN substrate surface tends to be large in the direction perpendicular (at 90°) to the saw marks compared to the direction parallel to the saw marks. Specifically, the RSM value measured in the wire moving direction, i.e., the value measured at the angle of 0° in FIG. 6 is on the order of 50 nm, the RSM value for surface inclined at 45° to the wire moving direction is on the order of 170 nm, and the RSM value for surface inclined at 90° is on the order of 330 nm, and the RSM value for surface inclined at 135° is on the order of 190 nm. This verifies that the surface roughness of the ground GaN substrate in Comparative Example 1 is anisotropic, affected by the saw marks.

Also, the dispersion of crystalline orientation distributions in the ground GaN substrate surface in Comparative Example 1 is measured by an X-ray diffraction method. Its result shows that the dispersion of crystalline orientation distributions in the ground GaN substrate surface in Comparative Example 1 is as large as a central value ±0.15° compared to Examples 1 and 2. This is considered to be because the sliced surface is disturbed by wire bending caused by forcibly high-speed cutting the GaN ingot.

Next on the ground GaN substrate surface in Comparative Example 1 is epitaxially grown 3 μm-thick GaN using MOVPE, to obtain the GaN substrate with an epitaxial layer. The depth-direction profile of a Fe impurity concentration in the GaN substrate with the epitaxial layer is measured by SIMS analysis. Its result shows that the Fe concentrations detected in the epitaxially grown GaN film and in the GaN substrate are not more than a lower detection limit ($2\times10^{15}$ $cm^{-3}$). However, the Fe concentration detected in the interface between the GaN substrate and the epitaxially grown GaN film is $2.2\times10^{17}$ $cm^{-3}$, which is not negligible in application to electronic devices such as optical devices.

Comparative Example 2

First, a 24.5 mm-thick GaN ingot is fabricated in the same manner as in Example 1. Subsequently, using the same conditions as in Example 1, the GaN ingot is sliced from the Ga polar side to N polar side, parallel to the (1 1 –2 2) plane, i.e., in the [1 1 –2 –3] direction. The slicing speed of the wire saw is set at 2 mm/h. The period of time required for completely cutting the 24.5 mm-thick GaN ingot is approximately 20 hours due to large wire bending during GaN ingot slicing. That is, in Comparative Example 2, the slicing speed is virtually 1.2 mm/h. This results in an as-sliced GaN wafer (23.5 mm×40 mm-sized and 0.6 mm-thick) in Comparative Example 2. Saw marks are clearly observed in the cut surface of the as-sliced wafer.

The damaged layer depth of the as-sliced wafer surface in Comparative Example 2 is calculated by microscopic Raman spectroscopy in the same manner as in Example 1. From this result, the damaged layer depth caused by slicing is considered to be on the order of 100 μm.

Subsequently, both surfaces of the as-sliced wafer in Comparative Example 2 are mirror-ground by 120 μm's. This results in a 0.36 mm-thick ground GaN substrate with mirror-ground surfaces. Since the ground GaN substrate in Comparative Example 2 is formed by slicing the GaN ingot in the [1 1 –2 –3] direction and subsequently grinding the sliced surfaces, its principal surface is a (1 1 –2 2) plane. In Comparative Example 2, the damaged layer depth is as deep as 120 μm compared to Example 2, and therefore a large amount of grinding is required for removing the damaged layer, and also the final ground GaN substrate thickness is as thin as 0.36 mm.

The surface roughness (RMS value) of the ground GaN substrate in Comparative Example 2 is measured under an atomic force microscope (AFM). The surface roughness measurement is performed in 4 directions inclined by 45°'s to a wire moving direction taken as a reference.

Figure 7:
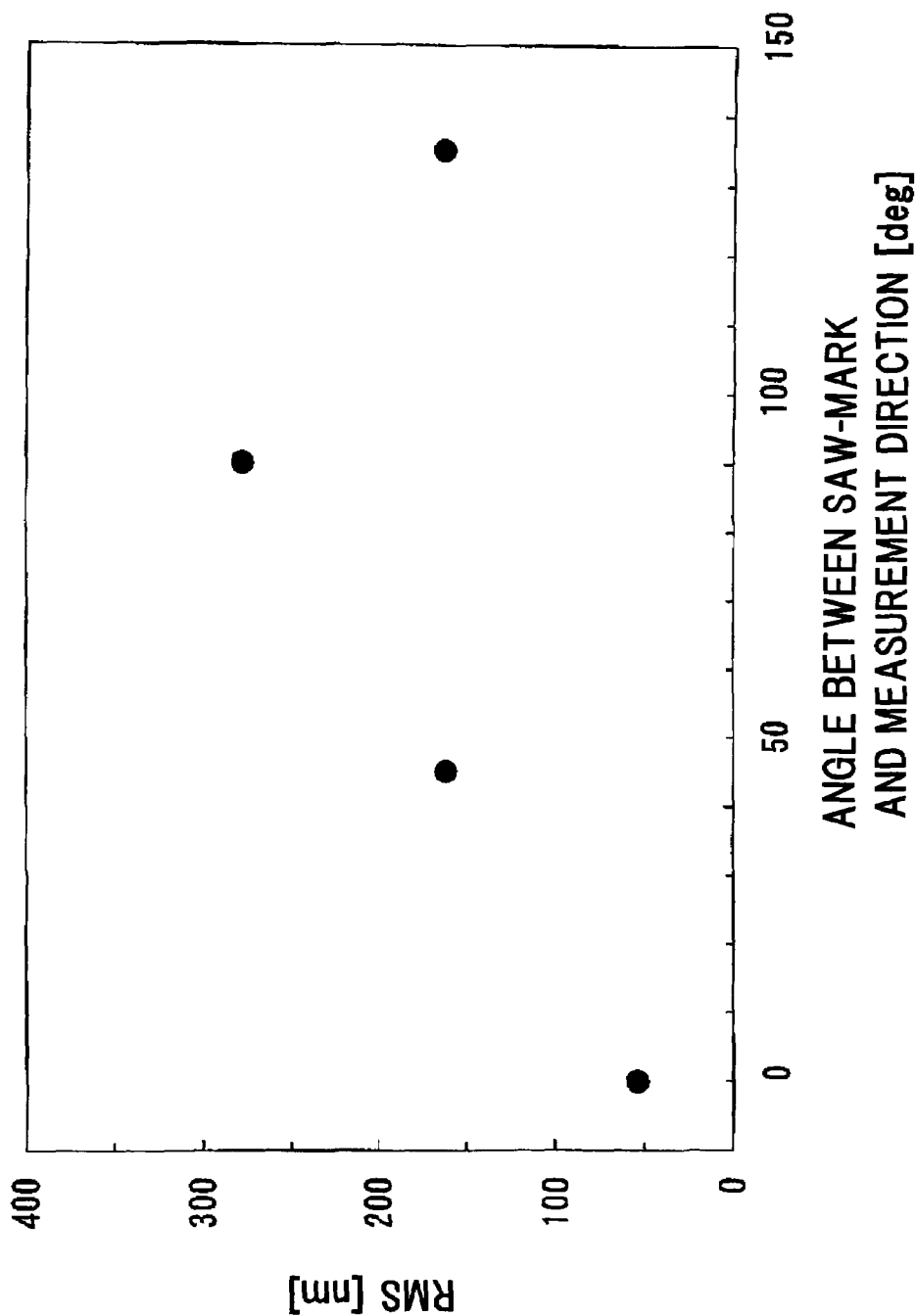
FIG. 7 is a diagram showing results of measuring surface roughness of a ground GaN substrate in Comparative Example 2.

FIG. 7 shows results of measuring surface roughness of the ground GaN substrate in Comparative Example 2.

Referring to FIG. 7, it is observed that the RSM value for the ground GaN substrate surface tends to be large in the direction perpendicular to the saw marks compared to the direction parallel to the saw marks. Specifically, the RSM value measured in the wire moving direction, i.e., the value measured at the angle of 0° in FIG. 7 is on the order of 50 nm, the RSM value for surface inclined at 450 to the wire moving direction is on the order of 160 nm, and the RSM value for surface inclined at 90° is on the order of 280 nm, and the RSM value for surface inclined at 1350 is on the order of 160 nm. This verifies that the surface roughness of the ground GaN substrate in Comparative Example 2 is anisotropic, affected by the saw marks.

Also, the dispersion of crystalline orientation distributions in the ground GaN substrate surface in Comparative Example 2 is measured by an X-ray diffraction method. Its result shows that the dispersion of crystalline orientation distributions in the ground GaN substrate surface in Comparative Example 2 is as large as a central value ±0.15° compared to Examples 1 and 2. This is considered to be because the sliced surface is disturbed by wire bending caused by forcibly high-speed cutting the GaN ingot.

Next on the ground GaN substrate surface in Comparative Example 2 is epitaxially grown 3 μm-thick GaN using MOVPE, to obtain the GaN substrate with an epitaxial layer. The depth-direction profile of a Fe impurity concentration in the GaN substrate with the epitaxial layer is measured by SIMS analysis. Its result shows that the Fe concentrations detected in the epitaxially grown GaN film and in the GaN substrate are not more than a lower detection limit ($2\times10^{15}$ $cm^{-3}$). However, the Fe concentration detected in the interface between the GaN substrate and the epitaxially grown GaN film is $5.8\times10^{16}$ $cm^{-3}$, which is not negligible.

Although the invention has been described with respect to the above embodiments, the above embodiments are not intended to limit the appended claims. Also, it should be noted that not all the combinations of the features described in the above embodiments are essential to the means for solving the problems of the invention.

What is claimed is:

1. A group III nitride semiconductor substrate production method, comprising:
   preparing a bulk crystal comprising a group III nitride semiconductor single crystal, the group III nitride semiconductor single crystal comprising one crystalline face and an other crystalline face, a hardness of the other crystalline face being softer than a hardness of the one crystalline face; and
   cutting the prepared bulk crystal, in a cutting direction, from the other crystalline face to the one crystalline face of the bulk crystal, wherein the cutting is performed at an angle from not less than 0 to not more than 45 degrees between the cutting direction and the [0 0 0 1] direction, wherein the damaged layer depth caused by the cutting positioned in a surface of the group III nitride semiconductor substrate exposed after the cutting is not more than 50 μm from the surface.

2. The method according to claim 1, wherein the cutting is performed by cutting the bulk crystal at a speed of not less than 2 mm/h.

3. A group III nitride semiconductor substrate formed by cutting a group III nitride semiconductor single crystal, comprising:
   a bulk crystal comprising the group III nitride semiconductor single crystal, the group III nitride semiconductor single crystal comprising one crystalline face and an other crystalline face, a hardness of the other crystalline face being softer than a hardness of the one crystalline face,
   wherein the bulk crystal is cut from the other crystalline face to the one crystalline face of the bulk crystal, and the cutting is performed at an angle from not less than 0 to not more than 45 degrees between the cutting direction and the [0 0 0 1] direction, wherein the damaged layer depth caused by the cutting positioned in a surface of the group III nitride semiconductor substrate exposed after the cutting is not more than 50 μm from the surface.

4. The group III nitride semiconductor substrate according to claim 3, wherein the absolute value of a difference between one surface roughness of a ground surface, exposed after grinding the damaged layer, in one direction parallel to the ground surface and the other surface roughness of the ground surface in another direction different from the one direction is not more than 10 nm.

5. The group III nitride semiconductor substrate according to claim 4, wherein the crystalline orientation distribution in the ground surface is not more than a central value ±0.05°.

6. The group III nitride semiconductor substrate according to claim 5, wherein the cutting is performed by a wire saw containing iron, and the iron concentration in the substrate is not more than $1\times10^{16}$ cm$^{-3}$.

* * * * *